(12) United States Patent
Maher

(10) Patent No.: US 9,018,982 B2
(45) Date of Patent: Apr. 28, 2015

(54) OVER-VOLTAGE TOLERANT LEVEL DETECTION CIRCUIT

(75) Inventor: Gregory A. Maher, Cape Elizabeth, ME (US)

(73) Assignee: Fairchild Semiconductor Corporation, San Jose, CA (US)

( * ) Notice: Subject to any disclaimer, the term of this patent is extended or adjusted under 35 U.S.C. 154(b) by 424 days.

(21) Appl. No.: 13/414,120

(22) Filed: Mar. 7, 2012

(65) Prior Publication Data

US 2012/0229120 A1  Sep. 13, 2012

Related U.S. Application Data

(60) Provisional application No. 61/449,876, filed on Mar. 7, 2011.

(51) Int. Cl.
*H03K 5/00* (2006.01)
*G01R 19/165* (2006.01)

(52) U.S. Cl.
CPC .................. *G01R 19/16519* (2013.01)

(58) Field of Classification Search
USPC .................. 327/50, 58, 60, 62, 142, 143, 198
See application file for complete search history.

(56) References Cited

U.S. PATENT DOCUMENTS

| | | | |
|---|---|---|---|
| 6,097,242 A | 8/2000 | Forbes et al. | |
| 6,650,154 B2 | 11/2003 | Okuyama | |
| 7,161,396 B1 | 1/2007 | Zhou et al. | |
| 7,812,649 B2 * | 10/2010 | Barnett | 327/143 |
| 7,852,129 B2 * | 12/2010 | Do | 327/143 |
| 8,106,688 B2 * | 1/2012 | Huang et al. | 327/143 |
| 8,633,742 B2 * | 1/2014 | Oh et al. | 327/143 |
| 2007/0080725 A1 * | 4/2007 | Byeon et al. | 327/143 |
| 2010/0148742 A1 | 6/2010 | Nakashima | |

FOREIGN PATENT DOCUMENTS

| | | |
|---|---|---|
| CN | 101188356 A | 5/2008 |
| CN | 102692539 A | 9/2012 |
| CN | 202649858 U | 1/2013 |
| KR | 10-2012-0102022 | 9/2012 |

OTHER PUBLICATIONS

"Chinese Application Serial No. 201210073669.4, Office Action mailed Feb. 26, 2014", 9 pgs.
"Chinese Application Serial No. 201220105386.9, Notification to Make Rectification mailed Jul. 19, 2012", 1 pg.
(Continued)

*Primary Examiner* — William Hernandez
(74) *Attorney, Agent, or Firm* — Schwegman Lundberg & Woessner, P.A.

(57) ABSTRACT

This document discusses, among other things, apparatus and methods for a detection circuit. In an example, the detection circuit can include a voltage divider configured to receive a first supply voltage from an external device coupled to the detection circuit, first and second transistors configured to receive a control voltage from the voltage divider and to couple an output to ground when the control voltage exceeds a first threshold, and a bias circuit configured to bias the first transistor to set the first threshold.

22 Claims, 3 Drawing Sheets

(56) References Cited

OTHER PUBLICATIONS

"Chinese Application Serial No. 201220105386.9, Office Action Received", 2 pgs.

"Chinese Application Serial No. 201220105386.9, Response filed Aug. 30, 2012 to Notification to Make Rectification mailed Jul. 19, 2012", 10 pgs.

\* cited by examiner

OVER-VOLTAGE TOLERANT LEVEL DETECTION CIRCUIT

CLAIM OF PRIORITY

This patent application claims the benefit of priority, under 35 U.S.C. Section 119(e), to Maher, U.S. Provisional Patent Application Ser. No. 61/449,876, entitled "OVER-VOLTAGE TOLERANT LEVEL DETECTION CIRCUIT," filed on Mar. 7, 2011, which is hereby incorporated by reference herein in its entirety.

BACKGROUND

As mobile electronic devices have become more common and the functionality of the devices have expanded, designers have implemented features that provide a better user experience. Automatic recognition of an attached accessory device is one of many such features. However, to implement these features, a detection circuit can be required that consumes significant power or can be susceptible to accessories that expose the circuit to substantially higher voltages than the mobile device can tolerate.

OVERVIEW

This document discusses, among other things, apparatus and methods for a detection circuit. In an example, the detection circuit can include a voltage divider configured to receive a first supply voltage from an external device coupled to the detection circuit, first and second transistors configured to receive a control voltage from the voltage divider and to couple an output to ground when the control voltage exceeds a first threshold, and a bias circuit configured to bias the first transistor to set the first threshold.

This section is intended to provide an overview of subject matter of the present patent application. It is not intended to provide an exclusive or exhaustive explanation of the invention. The detailed description is included to provide further information about the present patent application.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DETAILED DESCRIPTION

Electronic devices, including portable electronic devices, can include ports for accommodating accessory devices that extend or enhance the electronic devices. Such ports can include, but are not limited to, universal serial bus (USB) ports, for example. The ports can include a supply terminal to supply to, or receive power from, the accessory device. Some devices can include ports that allow connection of a diverse range of accessory devices. Some electronic devices include detection circuits to identify an accessory or an operating condition of an accessory, such as an external voltage coupled to a supply line or other terminal of the accessory port. The detection circuit can be active, and consume power, even when an accessory device is not present. For portable electronic devices that can have a limited power supply, such a circuit can reduce the useable interval of the device between charging of the limited power supply or replacement of the limited power supply. A detection circuit can include more expensive, high voltage components to accommodate the diverse array of accessory devices that can be coupled to the accessory port.

Figure 1:
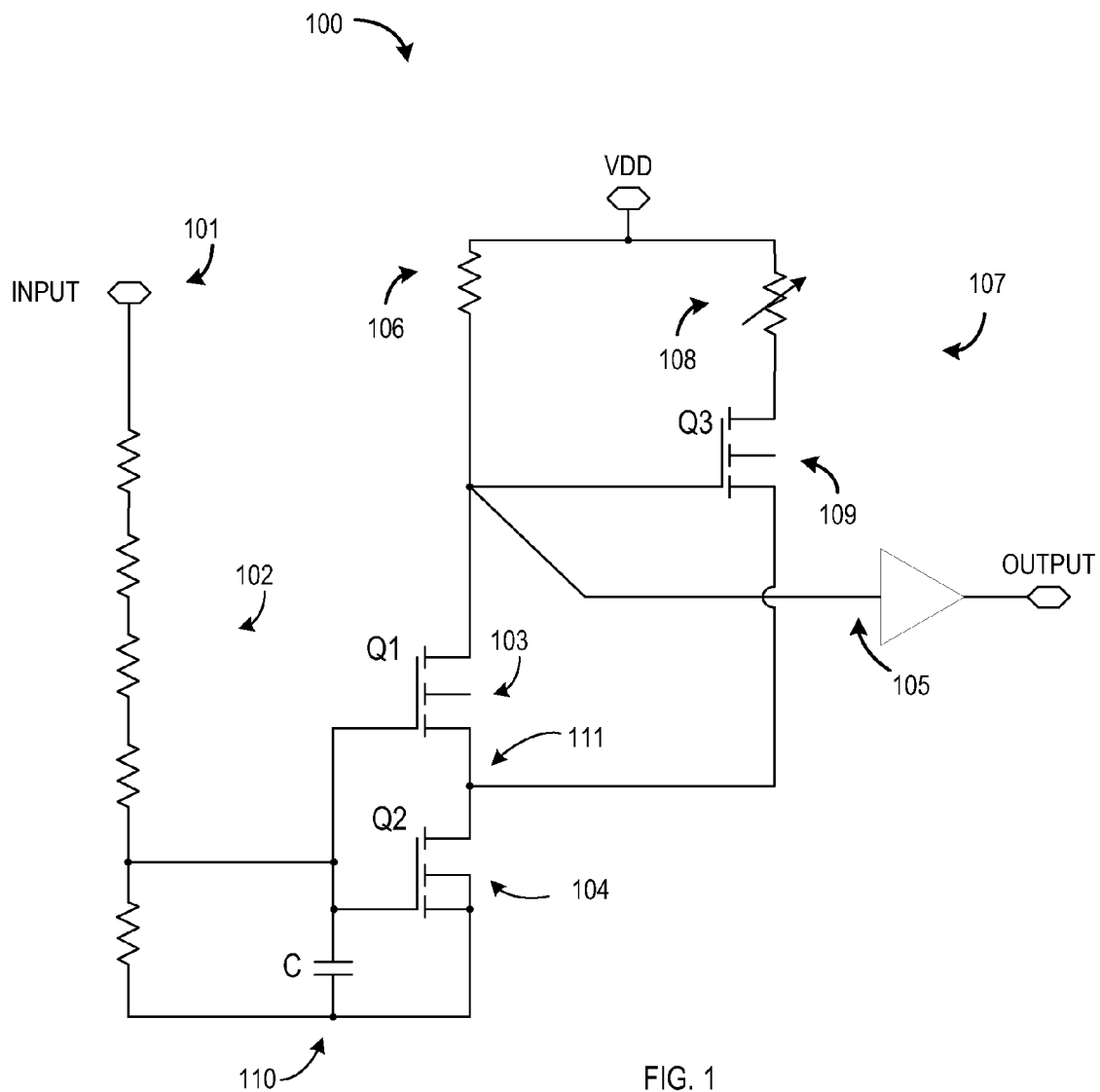
FIG. 1 illustrates generally an example detection circuit according to the present subject matter.

FIG. 1 illustrates generally an example detection circuit 100. In an example, a detection circuit 100 can include an output 105 configured to provide an indication that a device is coupled to an input 101. In certain examples, the detection circuit 100 can be employed with a mobile electronic system, such as a cell phone or personal media player. In some examples, the input 101 can include a portion of a communication connector, such as a universal serial bus (USB) connector. In certain examples, the input 101 can include a power supply terminal of a communication connector, such as a VBUS terminal of a USB connector. In an example, the output 105 can be indicative of a minimum threshold voltage present on the input 101.

The detection circuit 100 can include a voltage divider 102. The voltage divider 102 can include a tap that can be coupled to a control node of first and second transistors 103, 104. The first and second transistors 103, 104 can be coupled in series between the output 105 and a reference voltage, such as ground. In an example, the output 105 can be coupled to a pull-up resistor 106.

The detection circuit 100 can include bias circuitry 107. The bias circuitry 107 can include a setpoint resistance 108 and a bias switch 109, such as a transistor. The detection circuit 100 can detect a voltage level applied to the input 101 that is up to about four times higher than the gate oxide rating of a particular process, such as the process by which the first and second transistors 103, 104 are produced, without using high voltage components. The detection circuit 100 can be configured to use an external supply voltage coupled to the input 101 for power such that when an accessory is not connected to the input, the detection circuit 100 consumes substantially no power.

In certain examples, as a voltage applied at the input 101 rises, a scaled voltage can be applied to the control nodes of the first and second transistors 103, 104. The scaled voltage can cause the first and second transistors 103, 104 to conduct and pull the output 105 to a low logic level, thus providing an indication that a device is coupled to the input 101, for example. In certain examples, the detection circuit 100 can include additional logic, such as a buffer or an inverter, to isolate the detection circuit 100 from other circuits coupled to the output 105, or to provide a different logic level.

In an example, as the voltage at the input 101 rises, conduction through the first transistor 103 can be delayed using a bias voltage received at a pre-charge node 111 common to both the first and second transistors 103, 104. For example, the pre-charge node 111 can be biased to a voltage VDD–$Vt_{Q3}$, where $Vt_{Q3}$ is the threshold voltage of the bias switch 109 of the bias circuitry 107. As the second transistor 104 conducts, the voltage at the source can fall according to a function of the setpoint resistance 108. From a steady state viewpoint, the setpoint resistance 108 can allow non-linear adjustment of the threshold. In an example, the setpoint resistance 108 can be adjustable. In certain examples, a higher setpoint resistance can correspond to a lower threshold. Therefore, in certain examples, the output 105 of the detection circuit 100 can indicate not only that a device is coupled to the port, but that a voltage at the input 101 is at least at or above a minimum threshold voltage level.

In an example, a capacitor 110 can be used to filter out high frequency noise as well as control the edge rates of the voltage applied to the control nodes of the first and second transistors 103, 104. In certain examples, other passive or active devices can be used to provide edge rate control. In certain examples, an integrated circuit can include the first and second transistors 103, 104, the bias circuitry 107, and the pull-up resistance 106. In certain examples, the setpoint resistance 108 can include a semiconductor resistor. In certain examples, the integrated circuit can further include the edge rate control devices, such as the capacitor 110.

Figure 2:
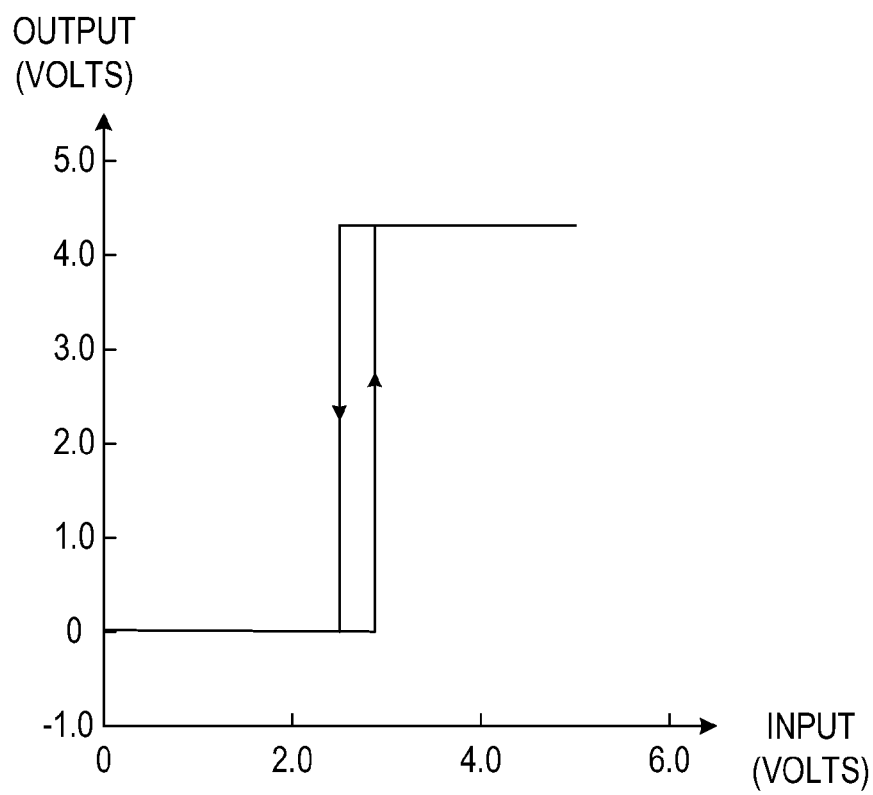
FIG. 2 illustrates generally a plot of the output of a detection circuit, such as the example shown in FIG. 1.

FIG. 2 illustrates generally a plot of the output of an example detection circuit, such as the example detection circuit 100 illustrated in FIG. 1. The output of the circuit is represented on the vertical axis and the input of the circuit is represented by the horizontal axis. In an example, as the voltage at the input 101 increases from zero, a control voltage, such as a control voltage for the first and second transistors 102, 103, rises. As the control voltage exceeds a threshold, the first transistor 103 couples the output 105 to ground. As the voltage at the input 101 falls, the control voltage triggers a high impedance state of the first transistor 103. The high impedance state of the first transistor 103 decouples the output 105 from ground and the pull-up resistor 106 pulls the output 105 to a high logic state.

Figure 3:
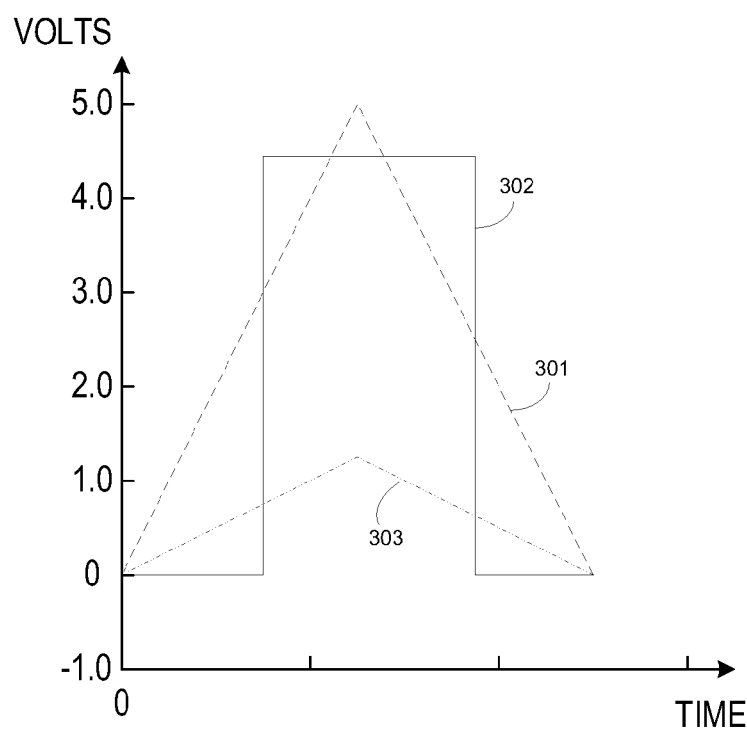
FIG. 3 illustrates generally transient waveforms of a detection circuit, such as the example shown in FIG. 1.

FIG. 3 illustrates generally transient waveforms of an example detection circuit, such as the example detection circuit 100 of FIG. 1, where the output includes an inverter. A voltage applied to the input can form a triangular waveform 301 as it transitions from 0 to about 5 volts and back to 0 volts. The output waveform 302 can go from a logic low level to a logic high level as the input voltage rises past about 3 volts. The output logic level can remain at a high level until the input voltage goes below about 2.5 volts. A second triangular waveform 303 can illustrate the scaled voltage of the input applied to the control nodes of the first and second transistors. Notice that the circuit provides a hysteretic behavior of the output in relation to the input voltage. For example, the output of the circuit transitions from low logic to high logic at a first input voltage and transitions from high logic to low logic at a second input voltage. In certain examples, the second input voltage is less than the first input voltage.

Figure 4:
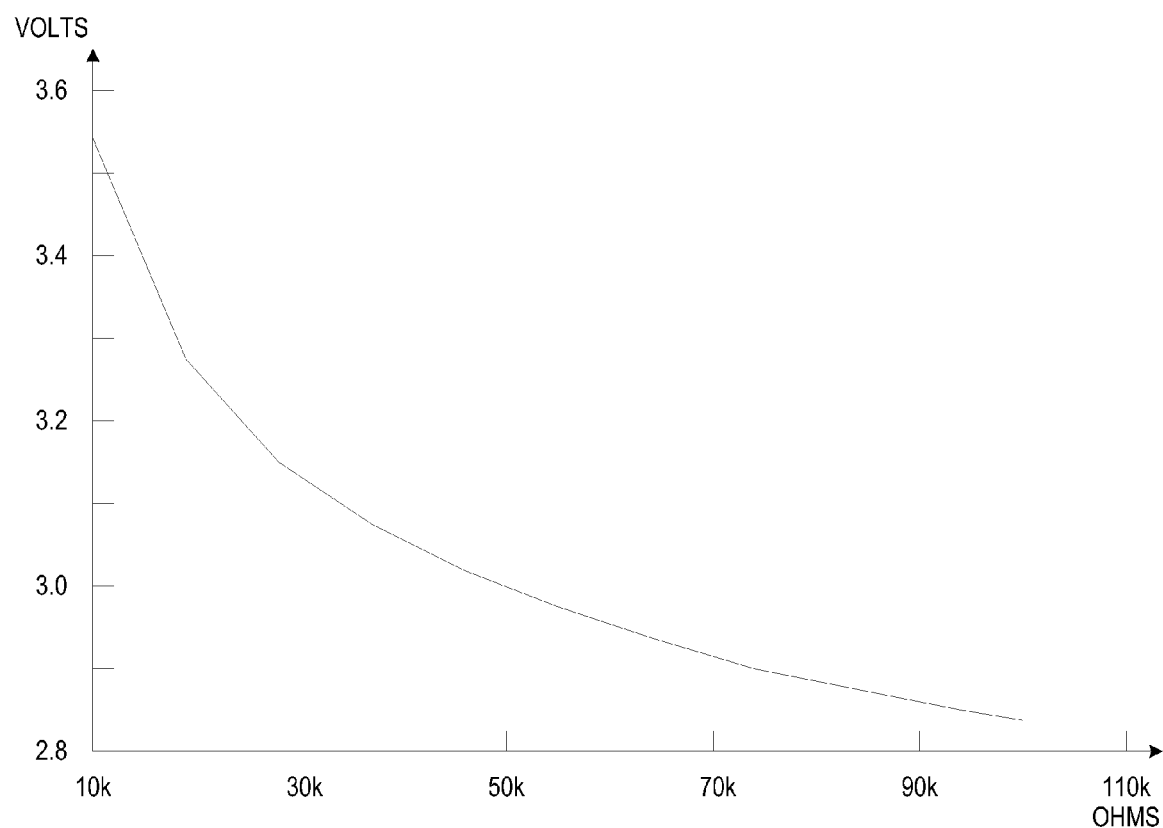
FIG. 4 illustrates generally a relationship of the setpoint resistance to the input voltage that will trigger transition of the output of a detection circuit, such as the example circuit of FIG. 1.

FIG. 4 illustrates generally a relationship of the setpoint resistance to the input voltage that will trigger a transition of the output of a circuit, such as the example circuit of FIG. 1.

Additional Notes

The above detailed description includes references to the accompanying drawings, which form a part of the detailed description. The drawings show, by way of illustration, specific embodiments in which the invention can be practiced. These embodiments are also referred to herein as "examples." All publications, patents, and patent documents referred to in this document are incorporated by reference herein in their entirety, as though individually incorporated by reference. In the event of inconsistent usages between this document and those documents so incorporated by reference, the usage in the incorporated reference(s) should be considered supplementary to that of this document; for irreconcilable inconsistencies, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In the appended claims, the terms "including" and "in which" are used as the plain-English equivalents of the respective terms "comprising" and "wherein." Also, in the following claims, the terms "including" and "comprising" are open-ended, that is, a system, device, article, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

The above description is intended to be illustrative, and not restrictive. In other examples, the above-described examples (or one or more aspects thereof) may be used in combination with each other. Other embodiments can be used, such as by one of ordinary skill in the art upon reviewing the above description. The Abstract is provided to comply with 37 C.F.R. §1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description, with each claim standing on its own as a separate embodiment. The scope of the invention should be determined with reference to the appended claims, along with the full scope of equivalents to which such claims are entitled.

What is claimed is:

1. A detection circuit comprising:
    a voltage divider configured to receive a first supply voltage from an external device coupled to the detection circuit;
    a first transistor having a first control node;
    a second transistor having a second control node, wherein the first and second transistors are configured to each receive a control voltage from the voltage divider on the first control node and the second control node and to couple an output to ground when the control voltage exceeds a first threshold; and
    a bias circuit configured to bias the first transistor to set the first threshold, wherein the bias circuit includes a resistor, and wherein the first threshold is set using the resistor.

2. The detection circuit of claim 1, wherein the detection circuit is configured to consume substantially no power from a circuit power supply when the first supply voltage is below a second threshold.

3. The detection circuit of claim 1, including a first resistor configured to pull the output to a circuit supply voltage when the first supply voltage is below a second threshold.

4. The detection circuit of claim 3, wherein the voltage divider is configured to receive a first supply voltage that is greater than a rated operating voltage of the first and second transistors.

5. The detection circuit of claim 1, wherein the resistor includes a semiconductor resistor device.

6. The detection circuit of claim 1, wherein a lower value of the first threshold corresponds to a higher resistance value of the resistor.

7. The detection circuit of claim 1, wherein the first and second transistors are coupled in series between the output and ground,
wherein the bias circuit includes a third transistor coupled to a pre-charge node common to the first and second transistors; and
wherein a control node of the third transistor is coupled to the output.

8. The detection circuit of claim 1, wherein the output is configured to transition from a high logic state to a low logic state as the control voltage increases past the first threshold voltage.

9. The detection circuit of claim 1, wherein the output is configured to transition from a low logic state to a high logic state as the control voltage decreases past a second threshold, wherein the first threshold is greater than the second threshold.

10. The detection circuit of claim 1, wherein an integrated circuit includes the voltage divider, the first and second transistors, and the bias circuit.

11. The detection circuit of claim 1, including a capacitor configured to control an edge rate of a transition of the control voltage.

12. A method of operating a detection circuit, the method comprising:
receiving a supply voltage from an external device coupled to a voltage divider of a detection circuit;
receiving a control voltage at a control node of a first transistor and a control node of a second transistor from the voltage divider, the first and second transistors coupled in series between an output of the detection circuit and ground;
coupling the output to ground when the control voltage exceeds a first threshold; and
biasing the first and second transistors to set the first threshold.

13. The method of claim 12, including adjusting a resistance of a bias circuit to set the first threshold.

14. The method of claim 13, wherein adjusting the resistance includes increasing the resistance to lower the first threshold.

15. The method of claim 12, decoupling the output from ground as the control voltage decreases past a second threshold, wherein the second threshold is less than the first threshold.

16. A system comprising:
a port;
a switch coupled to the port; and
a detection circuit configured to provide an indication that an external device is coupled to the port using a supply voltage of the external device, the detection circuit including:
a voltage divider configured to receive the supply voltage of the external device;
first and second transistors, coupled in series, configured to receive a control voltage from the voltage divider and to couple an output to ground when the control voltage exceeds a first threshold; and
a bias circuit configured to bias the first transistor to adjust the first threshold.

17. The system of claim 16, wherein the switch includes a universal serial bus (USB) switch.

18. The system of claim 16, wherein the port includes a USB port, and wherein the external device is configured to be coupled to the detection circuit using the USB port.

19. A detection circuit comprising:
a voltage divider configured to receive a first supply voltage from an external device coupled to the detection circuit;
a first transistor having a first control node;
a second transistor having a second control node, wherein the first and second transistors are configured to each receive a control voltage from the voltage divider on the first control node and the second control node and to couple an output to ground when the control voltage exceeds a first threshold; and
a bias circuit configured to bias the first transistor to set the first threshold;
wherein the first and second transistors are coupled in series between the output and ground,
wherein the bias circuit includes a third transistor coupled to a pre-charge node common to the first and second transistors; and
wherein a control node of the third transistor is coupled to the output.

20. A detection circuit comprising:
a voltage divider configured to receive a first supply voltage from an external device coupled to the detection circuit;
a first transistor having a first control node;
a second transistor having a second control node, wherein the first and second transistors are configured to each receive a control voltage from the voltage divider on the first control node and the second control node and to couple an output to ground when the control voltage exceeds a first threshold; and
a bias circuit configured to bias the first transistor to set the first threshold;
wherein the output is configured to transition from a high logic state to a low logic state as the control voltage increases past the first threshold voltage.

21. A detection circuit comprising:
a voltage divider configured to receive a first supply voltage from an external device coupled to the detection circuit;
a first transistor having a first control node;
a second transistor having a second control node, wherein the first and second transistors are configured to each receive a control voltage from the voltage divider on the first control node and the second control node and to couple an output to ground when the control voltage exceeds a first threshold; and
a bias circuit configured to bias the first transistor to set the first threshold;
wherein the output is configured to transition from a low logic state to a high logic state as the control voltage decreases past a second threshold, wherein the first threshold is greater than the second threshold.

22. A detection circuit comprising:
a voltage divider configured to receive a first supply voltage from an external device coupled to the detection circuit;
a first transistor having a first control node;
a second transistor having a second control node, wherein the first and second transistors are configured to each receive a control voltage from the voltage divider on the first control node and the second control node and to couple an output to ground when the control voltage exceeds a first threshold;

a bias circuit configured to bias the first transistor to set the first threshold; and a capacitor configured to control an edge rate of a transition of the control voltage.

* * * * *